US008749031B2

(12) United States Patent
Matsushima

(10) Patent No.: US 8,749,031 B2
(45) Date of Patent: Jun. 10, 2014

(54) SEMICONDUCTOR DEVICE, METHOD FOR MANUFACTURING SAME, AND SEMICONDUCTOR APPARATUS

(75) Inventor: Ryoji Matsushima, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 197 days.

(21) Appl. No.: 13/051,534

(22) Filed: Mar. 18, 2011

(65) Prior Publication Data

US 2012/0049331 A1 Mar. 1, 2012

(30) Foreign Application Priority Data

Sep. 1, 2010 (JP) ................................ 2010-195626

(51) Int. Cl.
*H01L 23/58* (2006.01)
*H01L 21/56* (2006.01)

(52) U.S. Cl.
USPC ...... 257/632; 257/77; 257/783; 257/E21.502; 257/E23.002; 257/E23.116; 438/113

(58) Field of Classification Search
CPC . H01L 21/68; H01L 24/26; H01L 2224/8085; H01L 2224/81855
USPC ........................................................ 257/777
See application file for complete search history.

(56) References Cited

U.S. PATENT DOCUMENTS

2009/0045525 A1* 2/2009 Matsushima et al. ......... 257/777

FOREIGN PATENT DOCUMENTS

JP 2007-123362 A 5/2007
JP 2009-49118 A 3/2009
JP 2010-4496241 B2 3/2009

* cited by examiner

*Primary Examiner* — Matthew W Such
*Assistant Examiner* — David Spalla
(74) *Attorney, Agent, or Firm* — Oblon, Spivak, McClelland, Maier & Neustadt, L.L.P.

(57) ABSTRACT

According to one embodiment, a semiconductor device includes a semiconductor device body and an insulating adhesive layer. The semiconductor device body is formed with a square plate shape and has an element portion provided on a first major surface. The insulating adhesive layer is provided to cover a second major surface of the semiconductor device body and one or two of four side faces of the semiconductor device body.

11 Claims, 14 Drawing Sheets

SEMICONDUCTOR DEVICE, METHOD FOR MANUFACTURING SAME, AND SEMICONDUCTOR APPARATUS

CROSS-REFERENCE TO RELATED APPLICATIONS

This application is based upon and claims the benefit of priority from the prior Japanese Patent Application No. 2010-195626, filed on Sep. 1, 2010; the entire contents of which are incorporated herein by reference.

FIELD

Embodiments described herein relate generally to a semiconductor device, a method for manufacturing the same, and a semiconductor apparatus.

BACKGROUND

To realize miniaturization and high-density mounting, a semiconductor apparatus with a plurality of semiconductor devices stacked and sealed within a package is already in used. The semiconductor devices are stacked, interposed with an adhesive, on a circuit substrate such as a wiring substrate or read frame. Then, to enable the provision of electrical power and input/output of electrical signals to each semiconductor device, electrode pads of semiconductor devices and the circuit substrate are connected with metal wire.

The adhesive for fixing the semiconductor devices in the stack may, for instance, be formed as an insulating adhesive layer that covers back faces of the semiconductor devices. In order to ensure that no short circuit occurs due to contact between side faces of the semiconductor devices and the metal wire, the insulating adhesive layer may also be formed on the side faces in addition to the back faces. By this method, short circuit defects in the semiconductor apparatus can be reduced.

However, in the processes for forming the insulating adhesive layer on the back face and side faces of the semiconductor devices, it is considered that, for instance, a shift can occur in the semiconductor device position, causing an error in the dicing position or the like and resulting in a breakage of the elements.

DETAILED DESCRIPTION

Figure 1A:
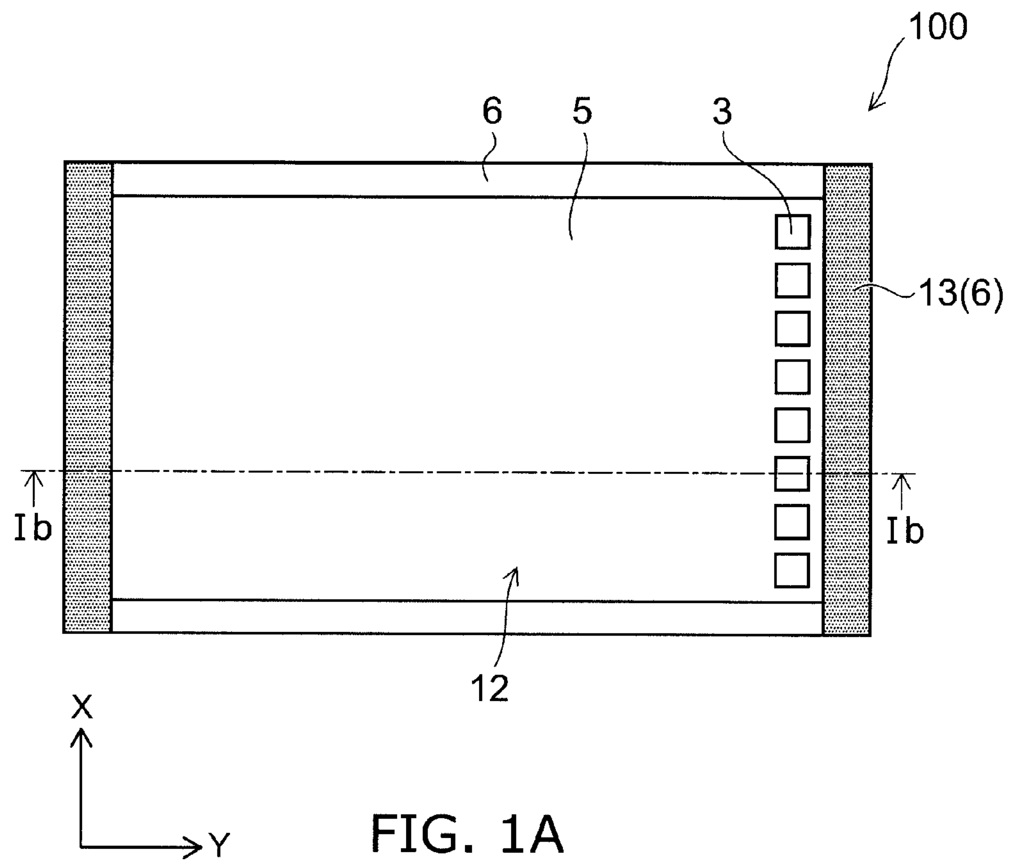
FIGS. 1A and 1B are schematic views illustrating a semiconductor device according to a first embodiment.

In general, according to one embodiment, a semiconductor device includes a semiconductor device body and an insulating adhesive layer. The semiconductor device body is formed with a square plate shape and has an element portion provided on a first major surface. The insulating adhesive layer is provided to cover a second major surface of the semiconductor device body and one or two of four side faces of the semiconductor device body.

Embodiments of the invention will now be described with reference to the drawings. In the following embodiments, components similar to those described in regard to a drawing thereinabove are marked with like reference numerals, and a detailed description is omitted as appropriate. Different components are described as appropriate.

First Embodiment

Figure 1B:
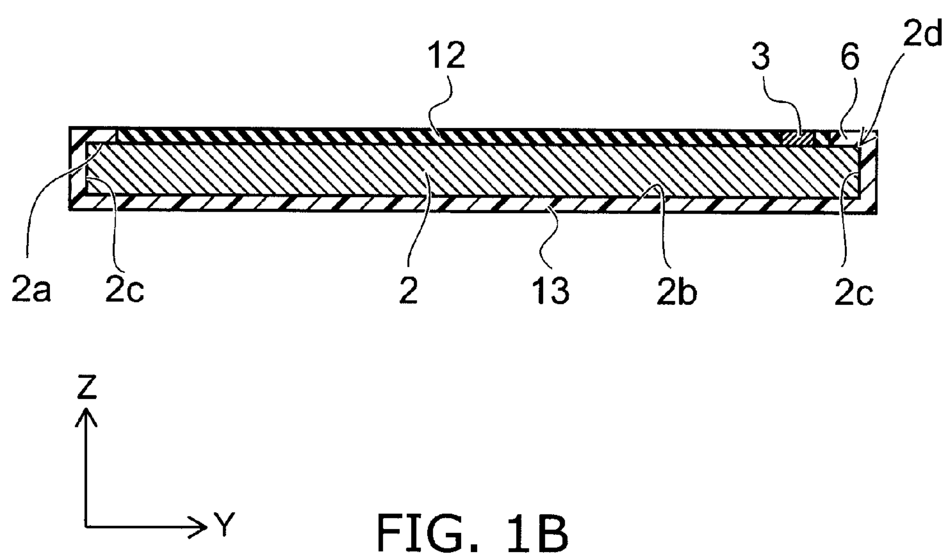

FIGS. 1A and 1B are schematic views illustrating a semiconductor device 100 according to a first embodiment. FIG. 1A illustrates a position of a first major surface 2*a*, and FIG. 1B illustrates a structure of cross-section taken through Ib-Ib in FIG. 1A.

The semiconductor device 100 according to the embodiment is, for instance, a nonvolatile memory device such as NAND flash memory, and includes a semiconductor device body 2 formed with a square plate shape. An element portion 5 is provided on a first major surface 2*a* of the semiconductor device body 2.

As illustrated in FIG. 1A, on the first major surface 2*a*, a peripheral portion 6 is provided surrounding the element portion 5.

The peripheral portion 6 is a so called "dicing region", and includes a region adjacent to the portion which is cut using a dicing blade when individual semiconductor devices 100 are separated from a wafer (the remaining region not cut in the dicing). In other words, the peripheral portion 6 has a portion that is electrically connected to the element portion 5.

An integrated circuit (not illustrated) is formed in the element portion 5.

A plurality of electrode pads 3 are provided at an edge of the element portion 5. The electrode pads 3 are terminals connecting the integrated circuit provided on the element portion 5 to an external circuit. The plurality of electrode pads 3 are disposed on only one side in a Y direction of the element portion 5 and are disposed along an X direction side of the semiconductor devices 100 (e.g. linearly). An insulating protective film 12 is provided so as to cover the first major surface 2*a* of the semiconductor device body 2 including the element portion 5. Here, the electrode pads 3 are exposed at openings formed in the insulating protective film 12. A portion of the insulating protective film 12 may be extended from the element portion 5 into the peripheral portion 6.

As illustrated in FIG. 1B, the insulating adhesive layer 13 is provided so as to cover a second major surface 2*b* of the semiconductor device body 2, and two side faces 2*c* that face the X direction. The insulating adhesive layer 13 extends from the side faces 2*c* to the first major surface 2*a*, covering the corners 2*d* between the side faces 2*c* and the first major surface 2*a*. The insulating adhesive layer 13 may be provided extending from the side faces 2*c* to the peripheral portion (dicing region) 6, and may be connected to the insulating protective film 12 provided on a surface of the element portion 5.

Here, in the Y direction, the insulating adhesive layer 13 covers an entirety of the side faces 2*c*. On the other hand, the insulating adhesive layer 13 is not formed on the two side faces that face the Y direction. In other words, the side face of the peripheral portion 6 is in an exposed state.

A manufacturing process for the semiconductor device 100 will be described with reference to FIGS. 2A to 6C and FIG. 14.

Figure 14:
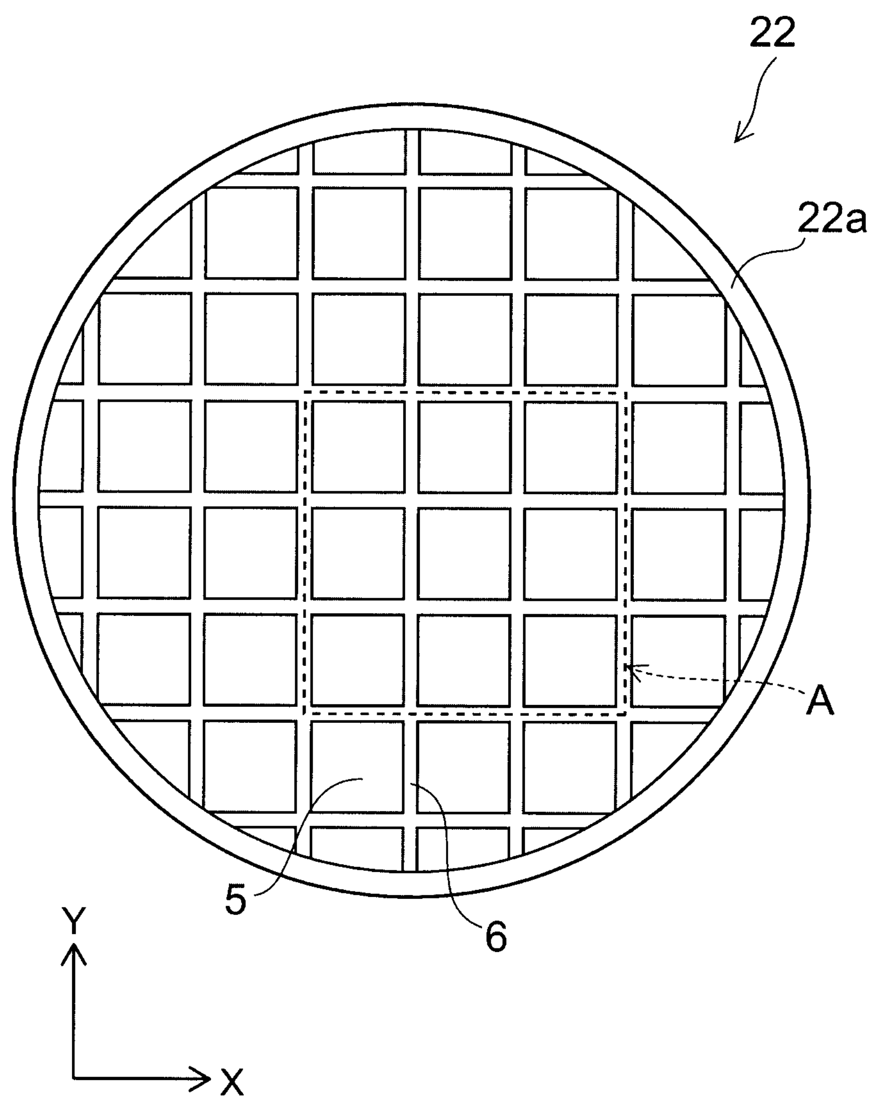
FIG. 14 is a plan view schematically illustrating a first major surface of a semiconductor substrate.

Firstly, as illustrated in FIG. 14, a plurality of the element portions 5 is disposed on a wafer 22 so that the element portion 5 is surrounded on four sides by the dicing region 6. FIG. 14 corresponds to a plan view from the first major surface 22*a* of the wafer 22. In the following, the wafer 22 is sometimes referred to as “semiconductor substrate 22”.

Figure 2A:
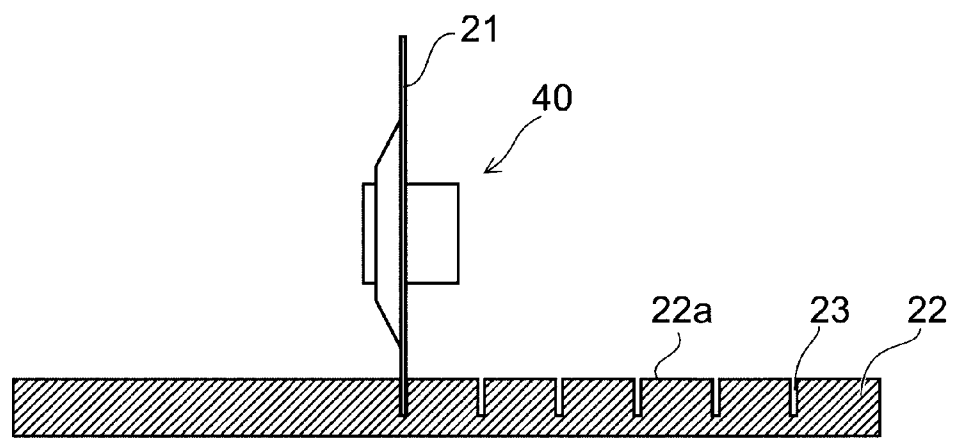
FIGS. 2A and 2B are schematic cross-sectional views illustrating a manufacturing process of the semiconductor device according to the first embodiment.

FIG. 2A is a cross-sectional view corresponding to the Y direction of FIGS. 1A, 1B, 7, and 14, and illustrating a state in which the semiconductor substrate 22 has been roughly half-cut with a dicer 40. This process may be referred to as a first dicing process.

First, a blade 21 set in the dicer 40 is aligned with an approximate center of the dicing region 6 provided between adjacent element portions 5, and the semiconductor substrate 22 is half-cut along the dicing region 6. A dicing direction is assumed to be only a single direction along an alignment direction of the electrode pads 3 provided on the element portion 5. Here, the alignment of the electrode pads 3 refers to a state such as that illustrated in FIG. 7. In FIG. 2A, the dicing region 6 along the X direction is half cut.

Consequently, a groove 23 is formed extending only in the electrode pads 3 alignment direction between the plurality of element portions 5 provided on the first major surface 22*a* of the semiconductor substrate 22. The groove 23 is formed to have a depth smaller than the thickness of the semiconductor substrate 22 but greater than the thickness of the semiconductor device body 2. The groove ends at a depth which does not result in separation of the semiconductor substrate 22 along the dicing region 6.

Figure 2B:
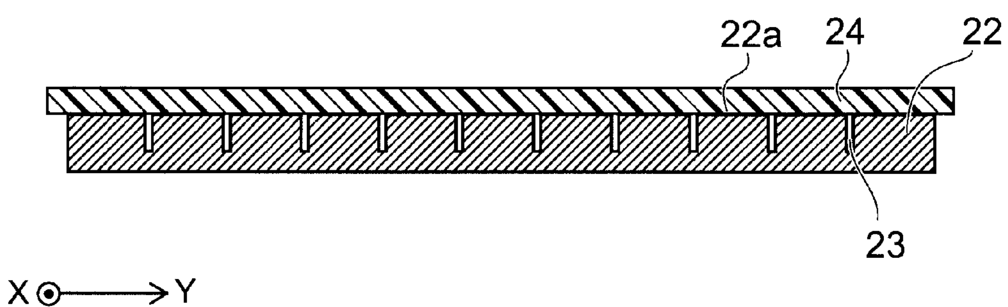

Next, as illustrated in FIG. 2B, a protective sheet 24 is adhered to the first major surface 22*a* of the semiconductor substrate 22 where the groove 23 is formed.

Figure 3A:
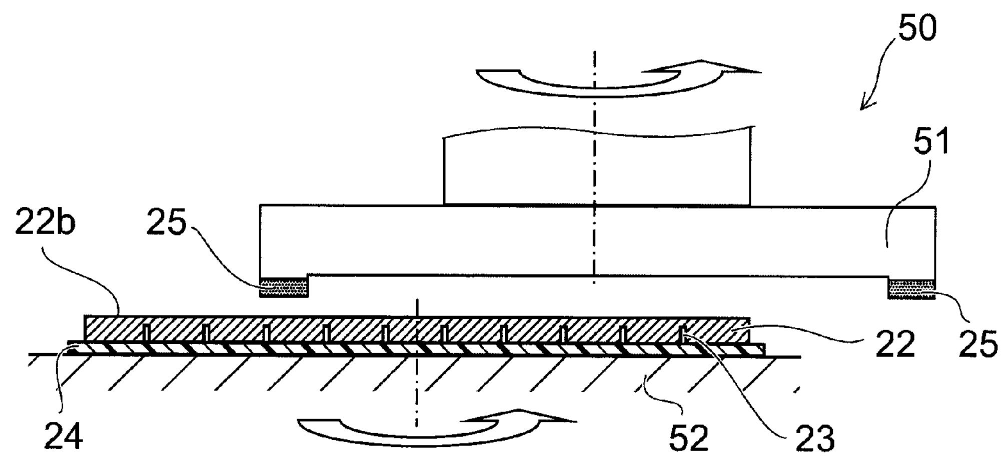
FIGS. 3A and 3B are schematic cross-sectional views illustrating the manufacturing process following after FIG. 2B.

Next, as illustrated in FIG. 3A, a back face 22*b*, which is a second major surface of the semiconductor substrate 22, is ground using a back grinder 50.

The semiconductor substrate 22 is mounted on a grinding stage 52 of a back grinder 50 with the back face 22*b* facing towards a grinding stone 25. The first major surface 22*a* to which the protective sheet 24 is adhered is subjected to vacuum suctioning, thereby fixing the semiconductor substrate 22 to the grinding stage 52.

Next, the back face 22*b* of the semiconductor substrate 22 is ground by bringing the grinding stone 25 into contact with the back face 22*b* of the semiconductor substrate 22 while rotating the grinding stage 52 and a grinding tool 51 to which the grinding stone 25 is attached.

The semiconductor substrate 22 is ground to the thickness of the semiconductor device body 2, and the groove 23 formed on the first major surface 22*a* side appears on the back face side. Accordingly, the semiconductor substrate 22 can be cut in the half-cut X direction. The result is the formation of a plurality of element arrays 10 that extend in the X direction and are arranged in the Y direction.

Moreover, by using, for instance, a tool having a buff or the like instead of the grinding tool 51 that has the grinding stone 25, the back face 22*b* of the semiconductor substrate 22 can be smoothly polished.

Figure 3B:
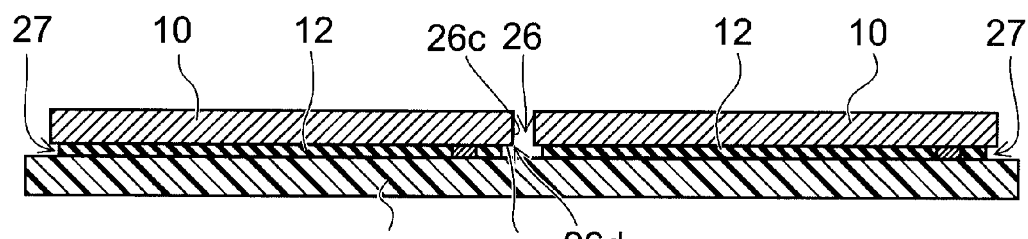

FIG. 3B illustrates a cross-section that the semiconductor substrate 22 is cut along the dicing region 6. The portion that is cut off is an element array 10 (see FIG. 7) in which the element portions 5 are aligned in a depth direction in FIG. 3B (X direction) and held by the protective sheet 24.

A gap 26 corresponding to the width of the groove 23 exists between adjacent element arrays 10. At the sidewalls of the gap 26, two side faces 26*c* of the element array 10 in the Y direction are exposed. Moreover, a gap 27 corresponding to the thickness of the insulating protective film 12 exists between the protective sheet 24 and the dicing region 6 of a surface side of the element array 10. In the gap 27, the dicing region 6 of the surface side of the element array 10 and corners 26*d* between the dicing region 6 and the side faces 26*c* are exposed.

Next, the insulating adhesive layer 13 is formed on the back face and the side faces of the plurality of element arrays 10 held by the protective sheet 24. To form the insulating adhesive layer 13, molding in which a predetermined resin is compression molded may, for instance, be used.

Figure 4A:
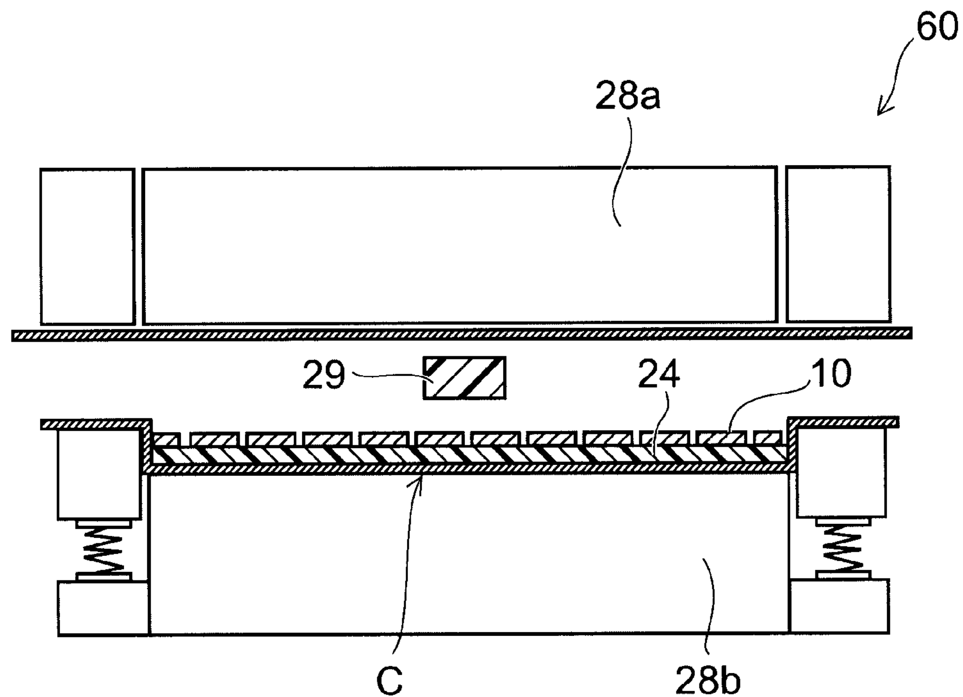
FIGS. 4A and 4B are cross-sectional views illustrating the manufacturing process following after FIG. 3B.

FIG. 4A is a cross-sectional view schematically illustrating a state in which the protective sheet 24 is mounted between molds 28*a* and 28*b* of a compression molder 60.

The element array 10 is held on the protective sheet 24 and mounted so as to expose the back face of the element array 10 to an interior of a cavity C of the molds 28*a* and 28*b*. Then, a resin material 29 that forms the insulating adhesive layer 13 is placed between the molds 28*a* and 28*b*.

Figure 4B:
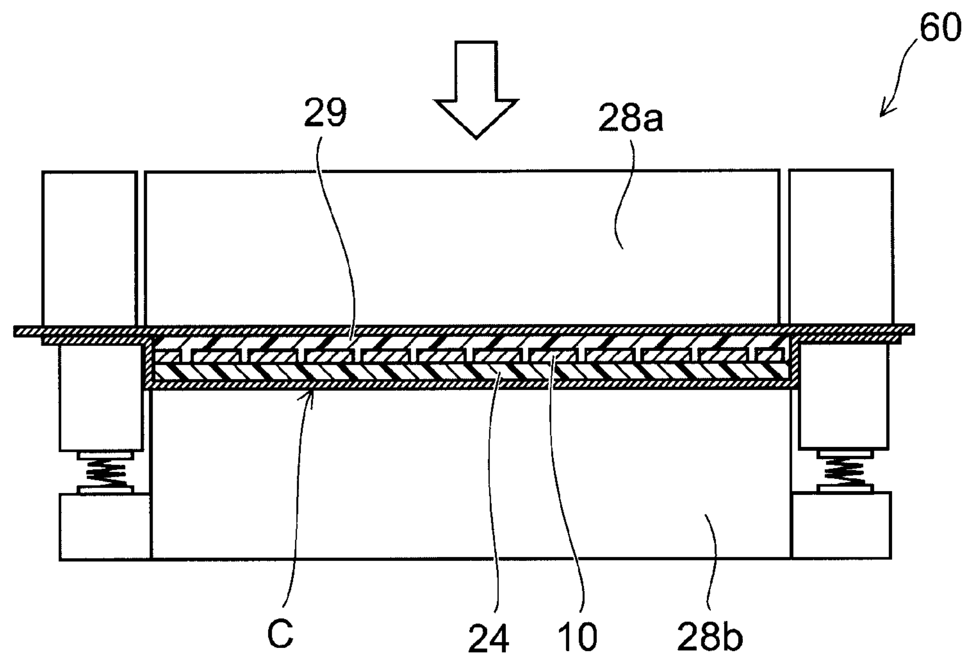

Next, as illustrated in FIG. 4B, the molds 28*a* and 28*b* are closed to mill and spread the resin material 29 over the entire surface of the protective sheet 24 on which the element array 10 is held. The temperature of the molds 28*a* and 28*b* is pre-adjusted to the softening temperature of the resin material 29. Then, the softened resin material 29 enters the gaps 26 and 27. In other words, the two side faces 26*c* and the corners 26*d* of the element array 10 and a surface of the dicing region 6 are covered with the resin material 29. The molds 28*a* and 28*b* are cooled, and the resin material 29 is cured.

For the resin material 29 that forms the insulating adhesive layer 13, a thermosetting insulating resin having adhesive properties, such as an epoxy resin may be used, for example.

A thermoplastic insulating resin such as an acryl resin may also be used if it has moldability suitable for compression molding and adhesive properties. Instead of using molding, a liquid resin may be applied and then dried to form the insulating adhesive layer 13.

Figure 5A:
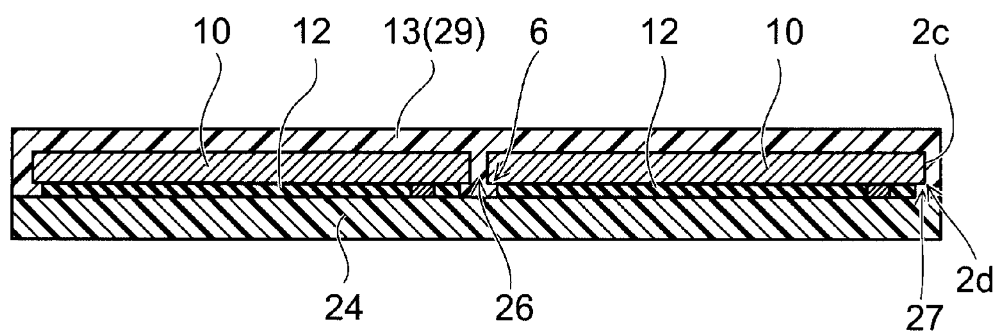
FIGS. 5A and 5B are cross-sectional views illustrating the manufacturing process following after FIG. 4B.

FIG. 5A is a cross-sectional view illustrating a state in which the insulating adhesive layer 13 has been formed on the back face and side faces of the element array 10 that is held on the protective sheet 24.

The milled resin material 29 is formed in layer-form so as to cover the back face of the element array 10. The gap 26 between adjacent element arrays 10 and the gap 27 between the surface of the dicing region 6 and the protective sheet 24 are filled. In this way, it is possible to form the insulating adhesive layer 13 that covers the back face and side faces of the element array 10, extends from the corners 2*d* between the side faces 2*c* and surface 2*a* to the dicing region 6 of the surface side and, and connects with the insulating protective film 12.

Here, the dicing region 6 in the Y direction is not cut. Hence, two side faces of the semiconductor device 100 in the X direction are not exposed. Consequently, the insulating adhesive layer 13 is only formed on the two side faces 2*c* of the semiconductor device 100 in the Y direction.

As described below, if, for instance, the resin material 29 is a thermosetting insulating resin, the insulating adhesive layer 13 may be formed in a half-cured (B stage) state to allow the attachment of the semiconductor device 100 to a circuit substrate 42 and the stacking and affixing the semiconductor devices 100.

In certain cases, the insulating adhesive layer 13 is formed on the side faces of the element array 10 but does not extend as far as the dicing region 6. For example, the protective sheet 24 may contact the dicing region 6 and the gap 27 may not be formed.

Next, in order to cut off the semiconductor devices 100 from the element array 10, the element array 10 is moved from the protective sheet 24 to a dicing sheet 30.

Figure 5B:
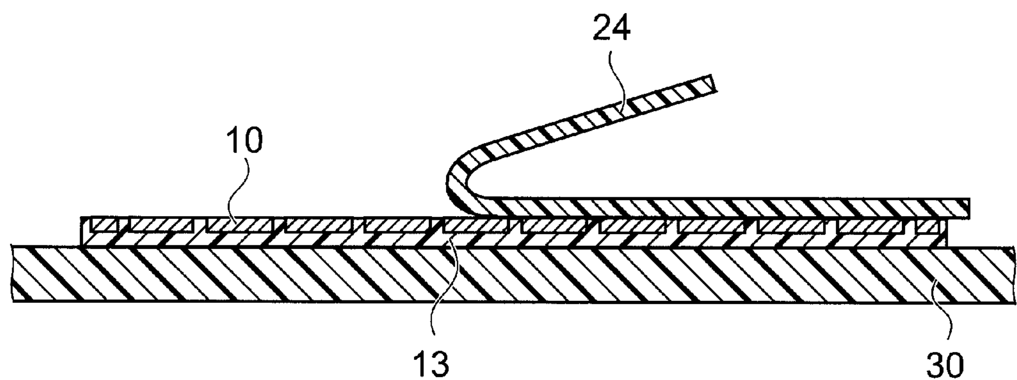

The protective sheet 24 that holds the element array 10 is removed from the molds 28*a* and 28*b*. Then, as illustrated in FIG. 5B, the dicing sheet 30 is adhered and thereby fixed to the back face side of the element array 10 on which the insulating adhesive layer 13 is formed. Next, the protective sheet 24 is peeled away to expose the surface of the element array 10 and a surface of the insulating adhesive layer 13 embedded in the gap 26 between adjacent element arrays 10.

Figure 6A:
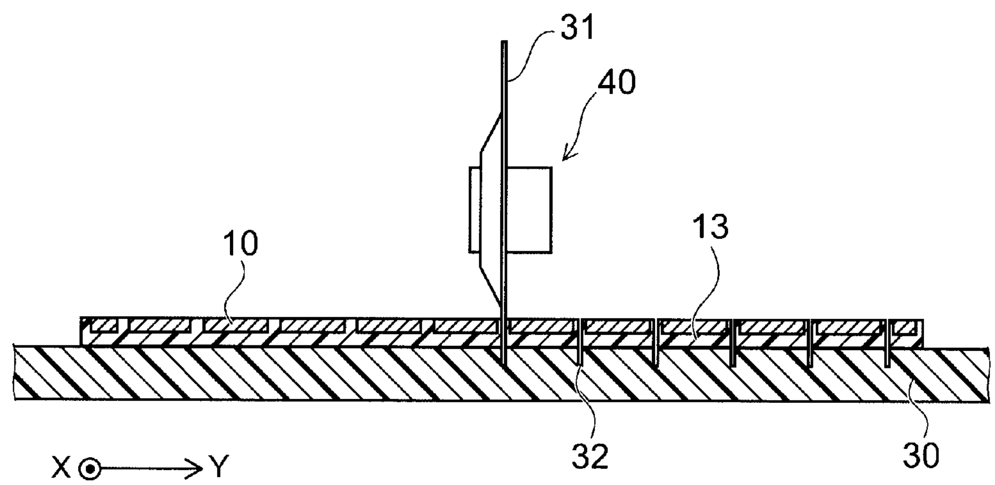
FIGS. 6A to 6C are cross-sectional views illustrating the manufacturing process following after FIG. 5B.

Next, as illustrated in FIG. 6A, the insulating adhesive layer 13 between adjacent element arrays 10 is cut using the dicer 40. In other words, a cut is made along the X direction in a manner similar to FIG. 2A.

A blade 31 used to cut the insulating adhesive layer 13 has a smaller blade thickness than the blade 21 illustrated in FIG. 2A. Accordingly, it is possible to make the cut and leave behind the insulating adhesive layer 13 formed on the side faces of the element array 10.

The dicing sheet 30 is rotated 90 degrees to change the dicing direction, and the element array 10 is then divided into the individual semiconductor devices 100. In other words, the dicing region 6 is cut along the Y direction.

Figure 6B:
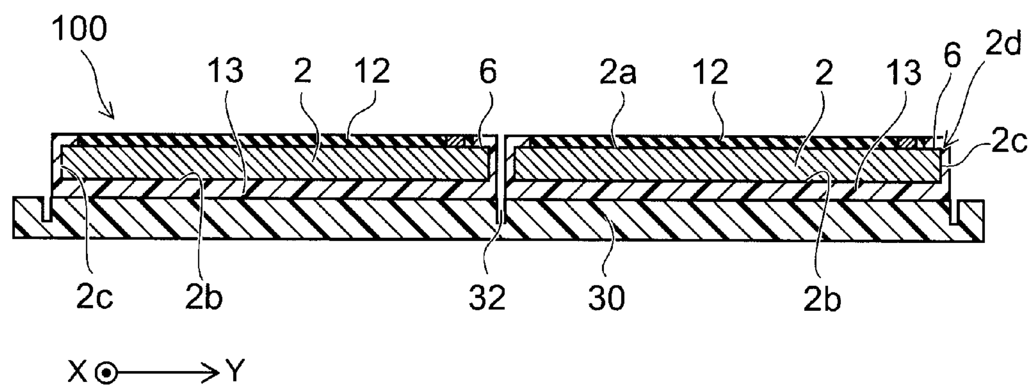

FIG. 6B illustrates a cross-section of the semiconductor device 100 cut off on the dicing sheet 30. The semiconductor devices 100 are separated by a groove 32 cut by the blade 31. The second major surface 2*b* and side faces 2*c* of the semiconductor device body 2 are covered by the insulating adhesive layer 13. The insulating adhesive layer 13 extends from the side faces 2*c* to the first major surface 2*a* of the semiconductor device body 2, covering the dicing region 6 and connected to the insulating protective film 12.

Figure 6C:
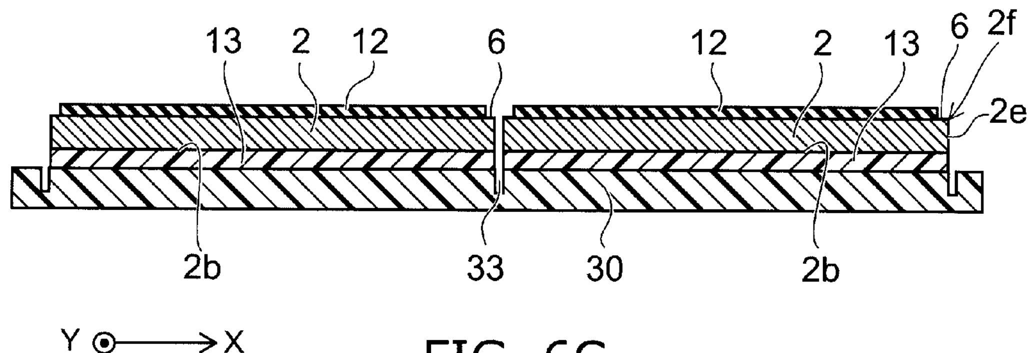

FIG. 6C is a cross-sectional view along the X-direction. Also in the Y-direction, the semiconductor devices 100 are separated by a groove 33 cut using the blade 31. The second major surface 2*b* of the semiconductor device body 2 is covered by the insulating adhesive layer 13. However, the side faces 2*e* of the semiconductor device body 2 in the X direction are exposed as portions of the wall faces of the groove 33. Moreover, the surface of the dicing region 6 in the X-direction is also exposed without being covered by the insulating adhesive layer 13. Similarly, corners 2*f* between the side faces 2*e* in the X direction and the dicing region 6 are also exposed.

In the embodiment described above, an example is described in which the dicer 40 is used in cutting the semiconductor substrate 22 and the insulating adhesive layer 13, but a laser dicer which cuts using laser light can also be used.

Figure 7:
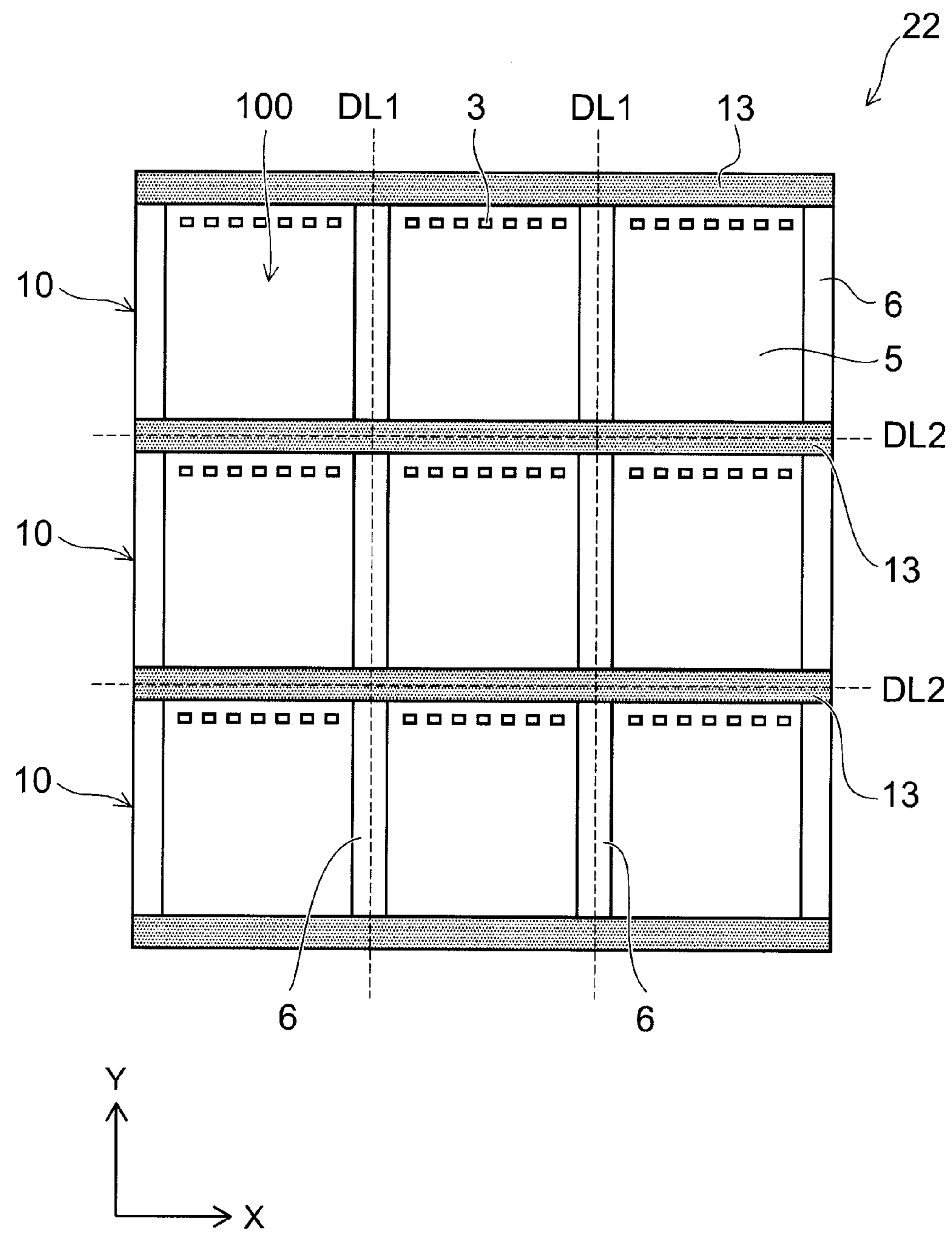
FIG. 7 is a plan view illustrating a state in which the semiconductor device according to the first embodiment has an insulating adhesive layer formed on a second major surface and side faces thereof and is adhered to a dicing sheet.

FIG. 7 is a plan view illustrating a state in which the element array 10 has been adhered to the dicing sheet 30 and the protective sheet 24 has been peeled away. This corresponds to a plan view from above of a first plane 22*a* of the wafer 22 after the process of FIG. 5B. FIG. 7 is an enlarged view of "A" in FIG. 14.

As illustrated in FIG. 7, the element array 10 includes a plurality of element portions 5 joined by the uncut dicing region 6 illustrated in the same drawing. The individual semiconductor devices 100 can then be separated by cutting along dicing lines DL1 and DL2, which are indicated by the broken lines in FIG. 7.

Also, as illustrated in FIG. 6A, by cutting the insulating adhesive layer 13 along the dicing line DL2, the individual semiconductor devices 100 can be separated while leaving behind the insulating adhesive layer 13 on the side faces of the element array 10, which forms the side faces 2*c* of the semiconductor device 100. Accordingly, it is possible to form the semiconductor devices 100 with the insulating adhesive layer 13 provided only on the two side faces 2*c*.

Figure 8:
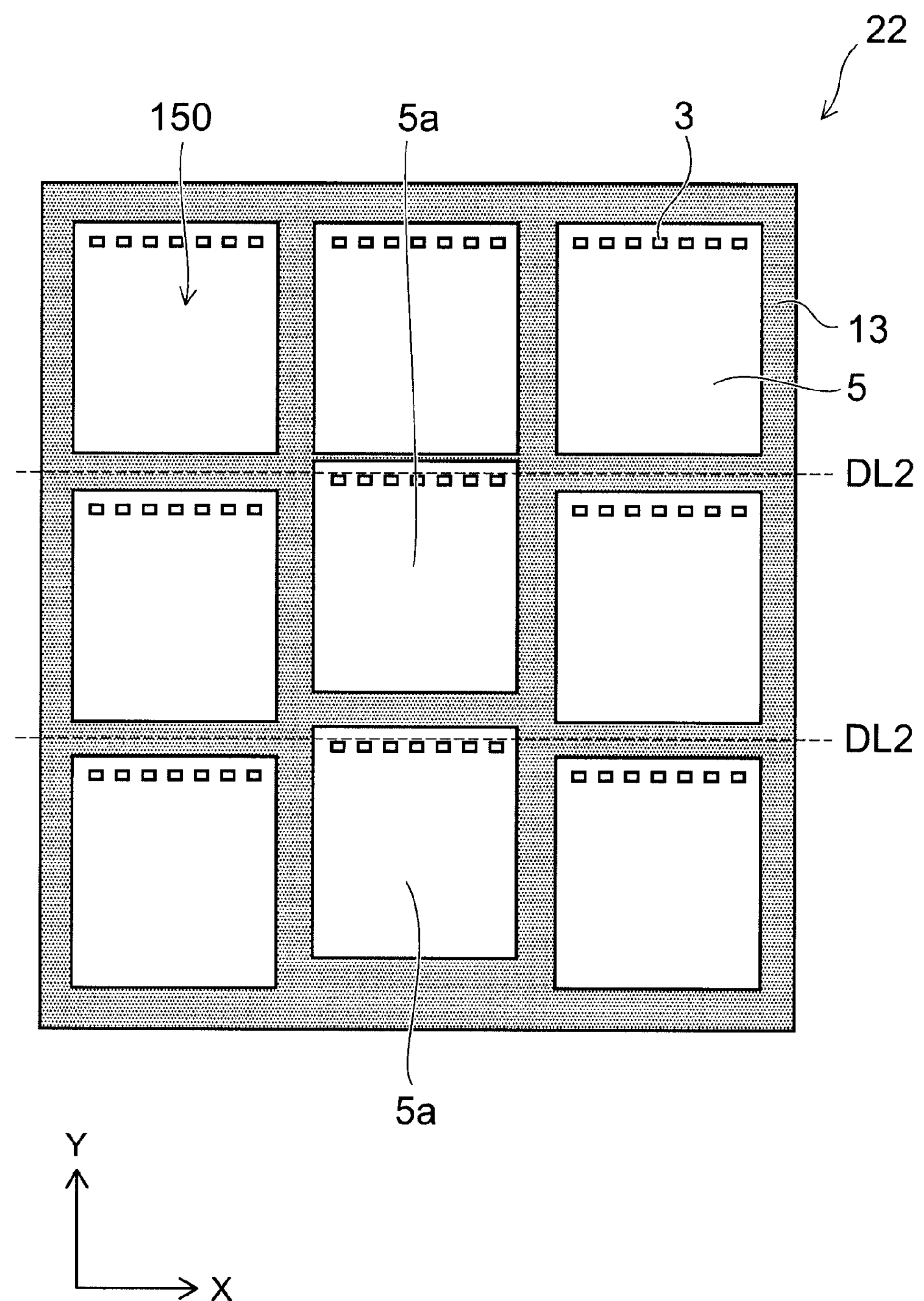
FIG. 8 is a plan view illustrating a state in which a semiconductor device according to a comparative example has an insulating adhesive layer formed on a second major surface and side faces thereof and is adhered to a dicing sheet.

FIG. 8 is a plan view illustrating a state in which a semiconductor device 150 according to a comparative example has the insulating adhesive layer 13 formed on a back face and side faces thereof, and is adhered to the dicing sheet 30.

In the semiconductor device 150, at the stage of the half-cut of the semiconductor substrate 22 illustrated in FIG. 2A, cuts are made in the alignment direction of the electrode pads 3 (X direction) and in the Y direction, which is orthogonal to the X direction. Hence, at the stage of grinding the back face 22*b* of the semiconductor substrate 22 until the cut groove 23 appears as illustrated in FIGS. 3A and 3B, the semiconductor substrate 22 is divided into the individual semiconductor devices 150.

Then, in the process to form the insulating adhesive layer 13, for instance, stretching of the protective sheet 24 may, in certain cases, generate positional shifts in the element portions 5. Thereafter, the processes of FIGS. 4A to 5B are performed. As a result, the insulating adhesive layer 13 is formed over all of the side faces of the semiconductor devices 150. Positions of the semiconductor devices 150 are fixed by curing the insulating adhesive.

For instance, if an element portion 5*a* is shifted sufficiently to overlap the dicing line DL2 like element portion 5*a* illustrated in the center of FIG. 8 and fixed in the shifted position, the element portion 5*a* is cut together with the insulating adhesive layer 13 in the linear cutting with the dicer 40. As result, a problem, which dicing yield is reduced, occurs.

On the other hand, if a laser dicer is used, the shift in position of the element portion 5*a* can be detected and the cutting position adjusted accordingly, thereby the insulating adhesive layer can be cut without destroying the element portion 5*a*. However, cutting with a laser dicer is expensive. There is also a further problem in that, if methods other than the laser dicer cannot be used, manufacturing equipment options are narrowed and the degree of freedom in the manufacturing process is restricted.

In contrast, in the manufacturing process for the semiconductor device 100 according to the embodiment, a form of the element array 10 with the plurality of element portions 5 connected in the X direction is maintained until the final cutting of the insulating adhesive layer 13. Therefore, with the semiconductor devices 100, it is possible to reduce the positional shift of the element portions 5 in the Y direction. On the other hand, the length of the element array 10 in the X direction is longer than the length of the semiconductor device 100 in the Y direction (the length of the element array 10 in the Y direction). Hence, the stretching of the protective sheet 24 fixing the element array 10 is suppressed and the shift in position in the X direction is small. As a result, in the manufacturing process for the semiconductor device 100 according to the embodiment, a reduction in dicing yield can be suppressed even when the dicer 40 is used.

Figure 9:
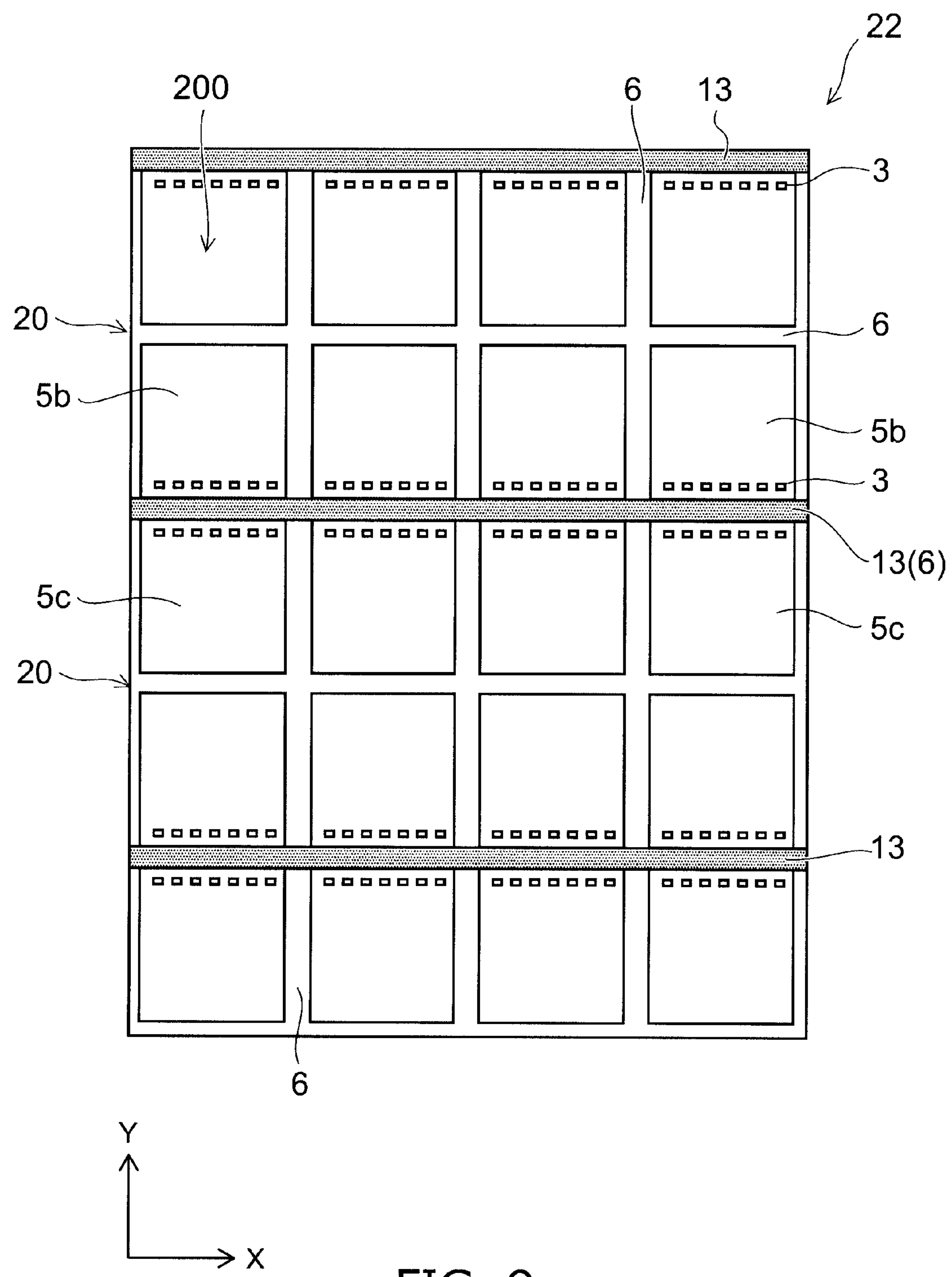
FIG. 9 is a plan view illustrating a state in which a semiconductor device according to a variation of the first embodiment has an insulating adhesive layer formed on a second major surface and side faces thereof and is adhered to a dicing sheet.

FIG. 9 is a plan view illustrating a state in which an element array 20 including semiconductor devices 200 according to a variation of the first embodiment has the insulating adhesive layer 13 formed on a back face and side faces of semiconductor devices, and is adhered to the dicing sheet 30.

As illustrated in FIG. 9, the electrode pads 3 of the semiconductor device 200 are disposed on only one side in the Y-direction of the element portion 5 and disposed along the X direction side of the semiconductor devices 200. Also in the Y direction, in the element portions 5*b* and 5*c*, edges provided with a plurality of electrode pads 3 are arranged in such a way that they oppose each other across the dicing region 6. On the other hands, the arrangement is such that any two adjacent edges that are disposed in the Y-direction and not provided with electrode pads 3 oppose also each other.

In the manufacturing process for the semiconductor device 200, only the dicing region 6 between the opposing edges provided with the electrode pads 3 is half-cut, and the insulating adhesive layer 13 is formed from the resin material 29 embedded in the region of the cut. Thus, in the element array 20 including the semiconductor devices 200, the element portion 5*b* and the element portion 5*c* are configured as two rows connected across the dicing region 6 between the edges not provided with the electrode pads 3.

Then, by finally cutting all the dicing regions 6 and insulating adhesive layers 13 with the dicer 40, the semiconductor device 200 having the second major surface 2*b* and one side face 2*c* covered with the insulating adhesive layer 13 can be manufactured.

With the semiconductor device 200 according to the variation as well, the form of the device array 20 with the two rows including the plurality of element portions 5*b* and 5*c* is maintained until the final separation into individual elements, and positional shifts in the element portions 5*b* and 5*c* are suppressed.

Of the four side faces, the insulating adhesive layer 13 can be formed on only one side face along an edge of the element portion provided with the electrode pads 3.

With reference to FIGS. 10A and 10B and FIGS. 11A to 11C, a semiconductor apparatus 400 on which the semiconductor device 100 according to the embodiment is mounted will be described.

Figure 10A:
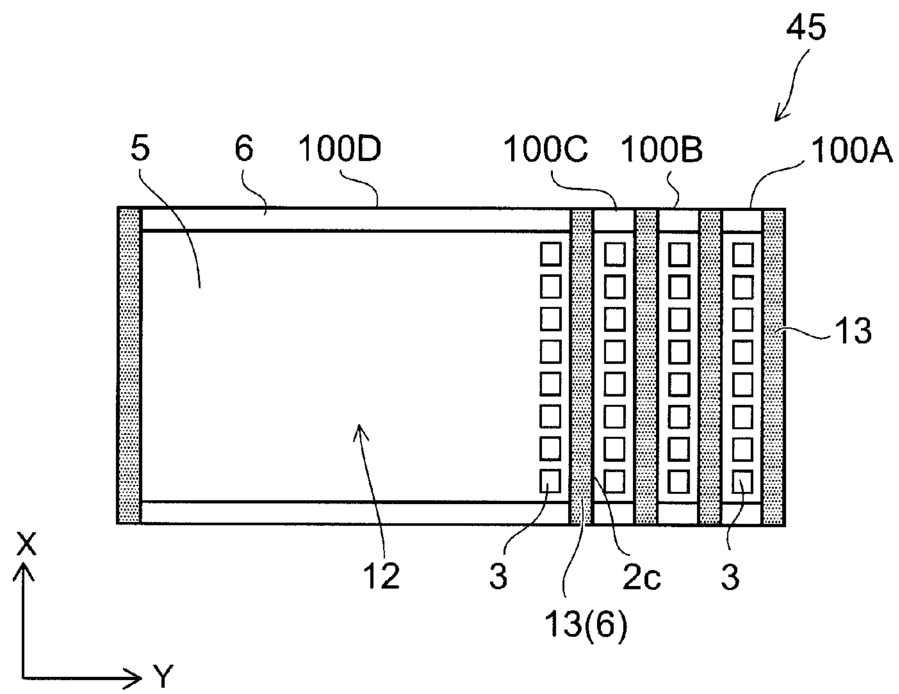
FIGS. 10A and 10B are schematic views illustrating a semiconductor apparatus on which the semiconductor device according to the first embodiment is mounted.

As illustrated in FIG. 10A, the semiconductor apparatus 400 has, for instance, a stacked structure 45 in which four semiconductor devices 100A to 100D are stacked. The semiconductor devices 100A to 100D are stacked with a shift in the Y direction so that the electrode pads 3 provided on each of the element portions 5 are exposed. The semiconductor devices 100A to 100D are also stacked in such a way that sides where the electrode pads 3 are disposed face in the same direction.

The insulating adhesive layer 13 is provided on the side faces 2*c* (Y-direction side faces) of the semiconductor devices 100A to 100D, where the plurality of electrode pads 3 are aligned. The insulating adhesive layer 13 extends from the side face 2*c* to the surface of the dicing region 6 around the element portion 5, and connects to the insulating protective film 12 covering the element portion 5.

On the other hand, the insulating adhesive layer 13 is not provided on the side faces 2*e* of the semiconductor devices 100A to 100D in the X direction. Moreover, the insulating adhesive layer 13 is not provided also on the surface 22*a* or the corners 2*f* in the X-direction of outer edges (dicing region 6) of the semiconductor devices 100A to 100D.

Figure 10B:
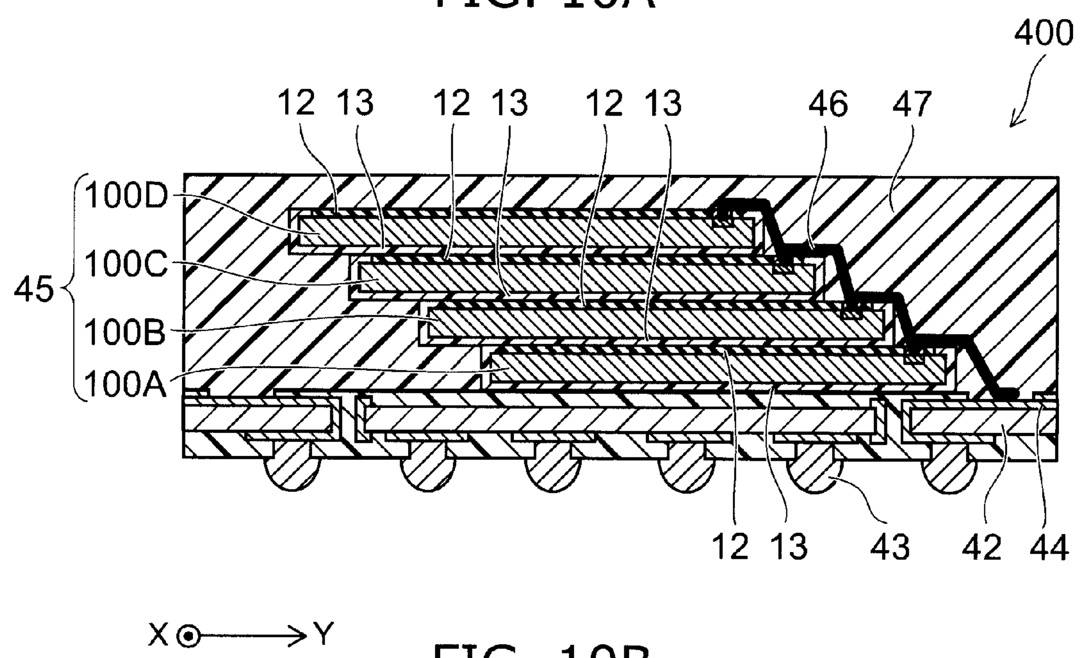

FIG. 10B is a schematic view illustrating a cross-sectional structure of the semiconductor apparatus 400.

The semiconductor apparatus 400 includes the stacked structure 45, and a circuit substrate 42 on which the stacked structure 45 is mounted. The circuit substrate 42 has a top surface space where the stacked structure 45 is mounted and a plurality of connection pads 44 provided around the space. In the embodiment, the plurality of connection pads 44 is arranged so as to oppose the plurality of electrode pads 3.

The connection pads 44 are connected to the electrode pads 3 of the semiconductor devices 100A to 100D included in the stacked structure 45 using, for instance, metal wire 46. The connection pads 44 are electrically connected to an external connection terminal 43 provided on a bottom face of the circuit substrate 42 by wiring provided on the surface and an interior of the circuit substrate 42.

As illustrated in FIG. 10B, the semiconductor devices 100A to 100D are sealed together with the metal wire 46 on the circuit substrate 42 using a sealing resin 47. An epoxy resin may, for instance, be used for the sealing resin 47, which can be formed by transfer molding.

The semiconductor apparatus 400 illustrated in FIG. 10B uses, for instance, a BGA (Ball Grid Array) package, and solder bumps are provided as the external connection terminal 43. As an alternative to the BGA package, an LGA (Land Grid Array) package can be also used. Also metal lands may, for instance, be provided as the external connection terminal 43.

Figure 11A:
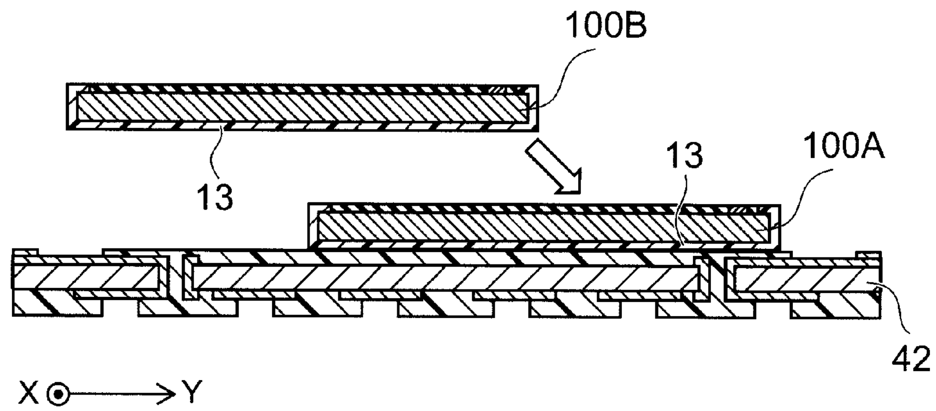
FIGS. 11A to 11C are schematic cross-sectional views illustrating an assembly process of the semiconductor apparatus.
Figure 11B:
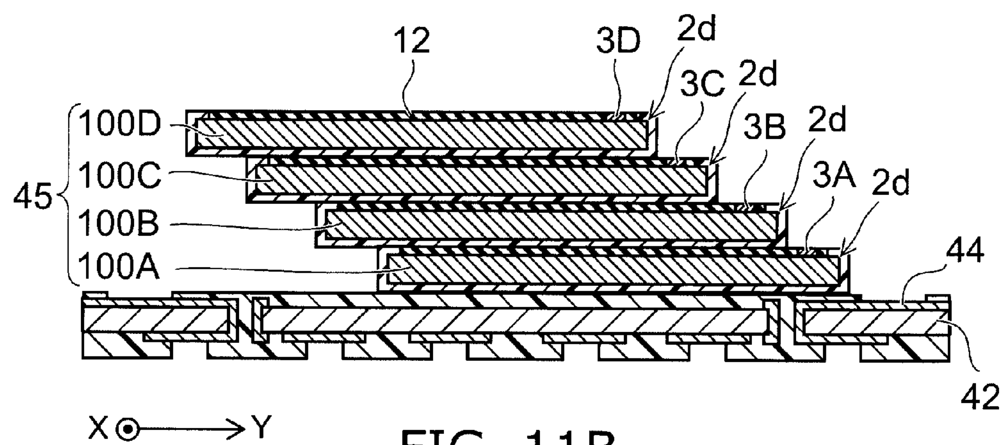
Figure 11C:
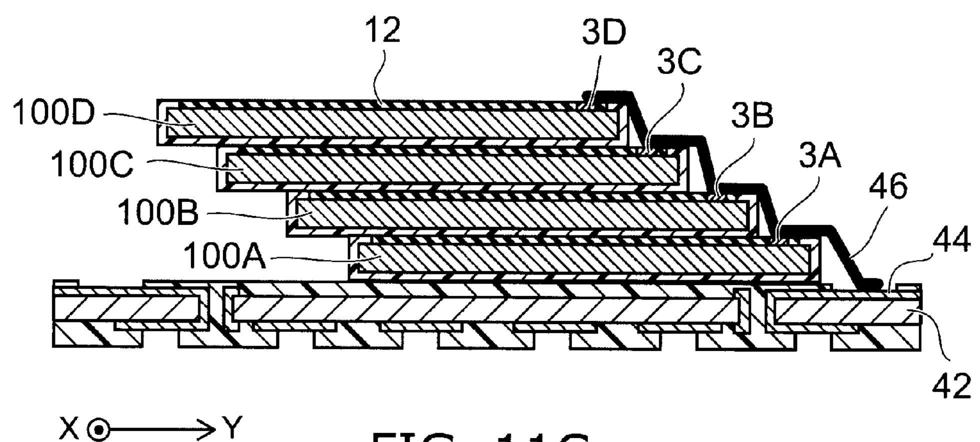

FIGS. 11A to 11C are schematic cross-sectional views illustrating an assembly process of the semiconductor apparatus 400.

As illustrated in FIG. 11A, the semiconductor device 100A is mounted on the top face of the circuit substrate 42, and the semiconductor device 100B is mounted on the semiconductor device 100A. At this time, the semiconductor device 100B is stacked on the semiconductor device 100A so that the sides on which the electrode pads 3 are disposed face the same direction.

A B-stage insulating adhesive layer 13 is formed on the second major surfaces 2*b* (hereinafter back faces) of the semiconductor devices 100A and 100B. The semiconductor devices 100A and 100B are then fixed, by applying pressure, to the top face of the circuit substrate 42 and the first major surface 2*a* (hereinafter surface) of the semiconductor device 100A, respectively.

For instance, when the semiconductor devices 100A and 100B have been mounted on the top face of the circuit substrate 42, the insulating adhesive layer 13 can be cured and fixed by performing a heat treatment.

Then, as illustrated in FIG. 11B, the semiconductor devices 100C and 100D are further stacked. At this time, the semiconductor device 100C is stacked on the semiconductor device 100B and the semiconductor device 100D is stacked on the semiconductor device 100C so that the sides on which the electrode pads 3 are disposed face the same direction. Thereafter, the stacked structure 45 can be provided by performing a heat treatment to cure the respective insulating adhesive layers 13.

As a base material for the circuit substrate 42, an insulating substrate such as a resin substrate, a ceramic substrate and a glass substrate may be used. Alternatively, a semiconductor substrate may be used. Specifically, for instance, a printed circuit board that uses a glass-epoxy resin, a bismaleimide-triazine resin or the like may be used.

Next, as illustrated in FIG. 11C, the connection pads 44 of the circuit substrate 42 and electrode pads 3A to 3D of the semiconductor devices 100A to 100D are connected with the metal wire 46. Hereinafter, this process may sometimes be referred to as a bonding wire process.

In the case of the electrical power supply line or clock signal line, for instance, the electrode pads 3A to 3D of the semiconductor devices 100A to 100D can be connected in order with the metal wire 46 as illustrated in FIG. 11C. On the other hand, the electrode pads 3A to 3D relating to signal inputs and outputs are connected to each of the corresponding connection pads 44.

As described above, the side faces 2*c* along the electrode pads 3 of the semiconductor apparatus 100A to 100D and the surface of the dicing region 6 are covered by the insulating adhesive layer 13 that connects to the insulating protective film 12. Hence, even when, for instance, the metal wire 46 contacts the corners 2*d* between the side faces 2*c* and the dicing region 6 and therearound, electrical insulation is maintained and there is low risk of a short circuit occurring.

Accordingly, for instance, when connecting electrode pads of the semiconductor devices 100A to 100D to the connection pads 44 with the metal wire 46, the height of a loop in the metal wire 46, which is provided to prevent contact with the corners 2*d*, can be reduced. As a result, the thickness of the semiconductor apparatus 400 can be reduced, helping to enable miniaturization and thickness reduction, and also to improve yield and reliability.

Since there is low risk of short circuit due to the metal wire 46 contacting the surfaces of the semiconductor devices 100A to 100D, the metal wire 46 may be allowed to contact the insulating protective film 12 and the insulating adhesive layer 13. As a result, the wire bonding operation becomes easier. Also, when forming the sealing resin 47, the resistance of the metal wire 46 to the flow of the molten resin is improved, and wire sweep can be prevented. The occurrence of short circuiting defects caused by contact between wires is then suppressed and the manufacturing yield and reliability of the semiconductor apparatus 400 can be improved.

In the above-described embodiment, the metal wire 46 was used to connect the electrode pads 3 and the connection pads 44, but the connection method is not limited thereto. As described above, in the case where the insulating adhesive layer 13 extends from the side face 2*c* over the dicing region 6 and connects to the insulating protective film 12, the surfaces of the semiconductor devices 100A to 100D between the electrode pads 3 and the connection pads 44 are electrically insulated. However, electrical connections can be made by applying a conductive resin between the electrode pads 3 and the connection pads 44. Accordingly, a smaller, thinner semiconductor apparatus 400 can be realized. Moreover, since the wiring between the electrode pads 3 and the connection pads 44 can be fixed, it is possible to suppress short circuits and wire breakage and improve yield and reliability.

In the semiconductor devices 100 and 200 according to the embodiment, the number of side faces 2*c* on which the insulating adhesive layer 13 is provided is limited to one or two of the four side faces of the semiconductor device body 2. On the other hand, in the semiconductor device 150 according to the comparative example, the insulating adhesive layer 13 is provided on all four of the side faces of the semiconductor device body 2.

For instance, in the case where the elastic modulus or the like of the insulating adhesive layer 13 and the sealing resin 47 are different, moisture resistance deteriorates and separation of the insulating adhesive layer 13 and the sealing resin 47 may occur.

Hence, it may be advantageous to reduce the number of side faces on which the insulating adhesive layer 13 is formed. In the semiconductor devices 100 and 200 according to the embodiment, the insulating adhesive layer 13 provided on the side faces of the semiconductor device body 2 is minimized to enable an increase in reliability.

At the time of the bonding wire process, the insulating adhesive layer 13 is not formed on the side faces 2*e* and the corners 2*f* of the semiconductor devices 100A to 100D in the X direction. Here, it may be thought that there is a risk of short circuiting caused by contact between the metal wire 26 and the corners 2*f*. However, the metal wire 26 does not extend in a direction of the side faces 2*e*. Therefore, there is low risk of the metal wire 26 and corners 2*f* contacting.

On the other hand, in the comparative example illustrated in FIG. 8, all the side faces of the semiconductor devices are covered with the insulating adhesive layer 13. Specifically, even the corners 2*f*, which are not at risk of contacting the metal wire 26, are covered with the insulating adhesive layer 13. As a result, the material that forms the insulating adhesive layer 13 is wasted, and precious resources are needlessly consumed.

In contrast, in the semiconductor devices 100 and 200 according to the embodiment, the corners 2*f*, which the metal wire 26 is not provided on and there is low risk of short circuit defects occurring, are not covered with the insulating adhesive layer 13, and the needless consumption of resources can therefore be prevented.

Second Embodiment

Figure 12:
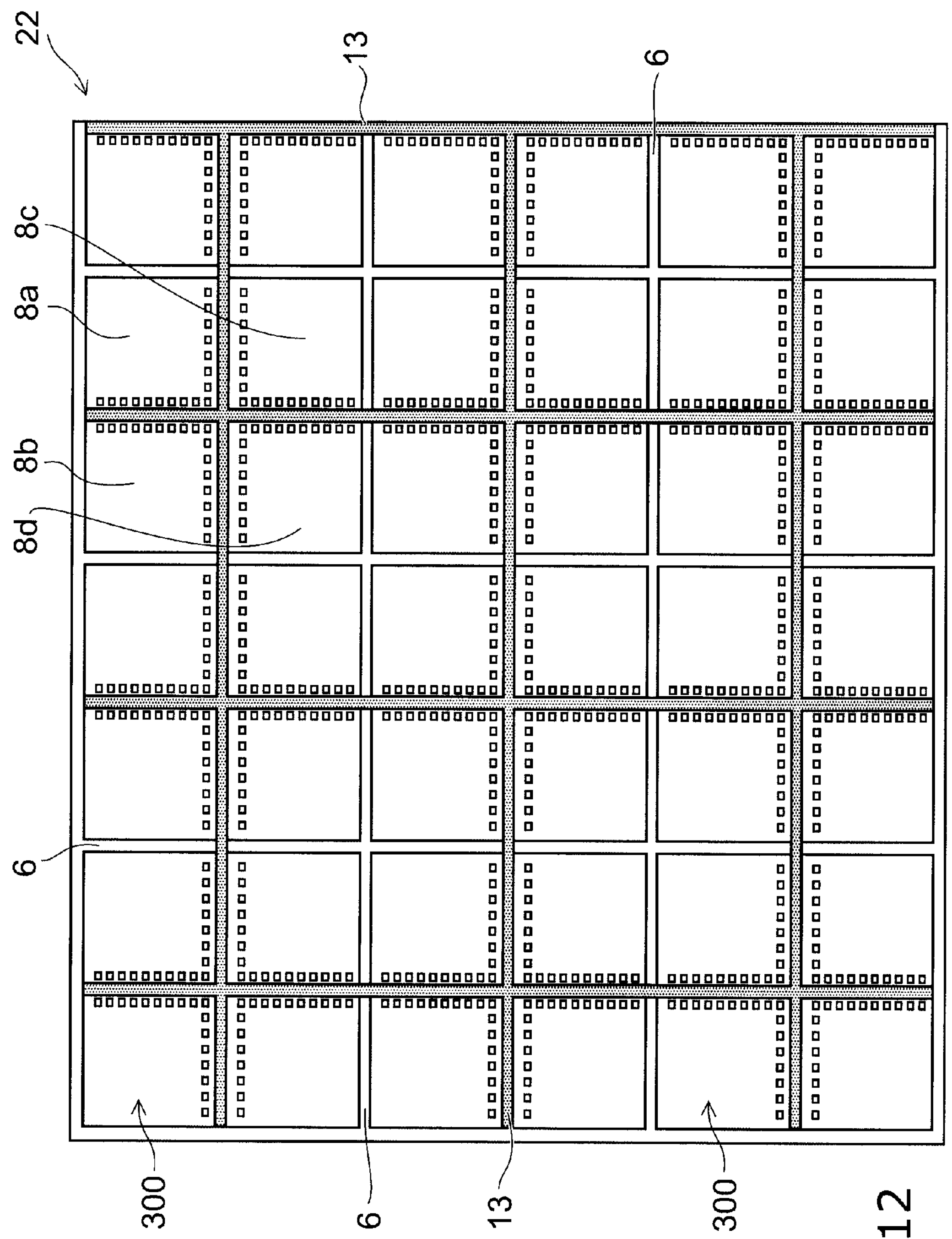
FIG. 12 is a plan view illustrating a state in which a semiconductor device according to a second embodiment has an insulating adhesive layer formed on a second major surface and side faces thereof and is adhered to a dicing sheet.

FIG. 12 is a plan view illustrating a state in which a semiconductor device 300 according to a second embodiment has the insulating adhesive layer 13 formed on a second major surface 2*b* (back face) and side faces 2*c* thereof, and is adhered to the dicing sheet 30.

In the semiconductor device 300 according to the embodiment, the electrode pads 3 are provided along adjacent edges in element portions 8*a* to 8*d*. In other words, the electrode pads 3 are provided along one side face in the X direction and one side face in the Y direction of the semiconductor device 300. As illustrated in FIG. 12, in the case where the first major surface 22*a* of the wafer 22 is viewed from above, the edges provided with the electrode pads 3 are arranged to oppose each other. As a result, the half-cut (see FIG. 2A) can be limited to the dicing region 6 along the edges provided with the electrode pads 3.

Accordingly, it is possible to form the insulating adhesive layer 13 on only the two side faces 2*c* along the edges provided with the electrode pads 3.

Figure 13A:
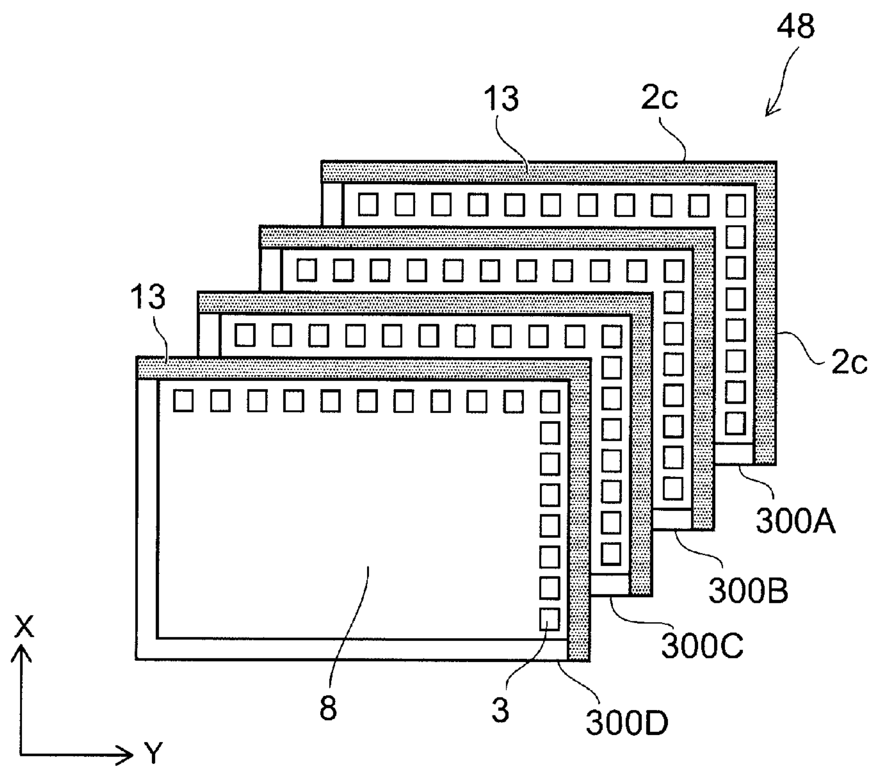
FIGS. 13A and 13B are schematic views illustrating a semiconductor apparatus on which the semiconductor device according to the second embodiment is mounted.
Figure 13B:
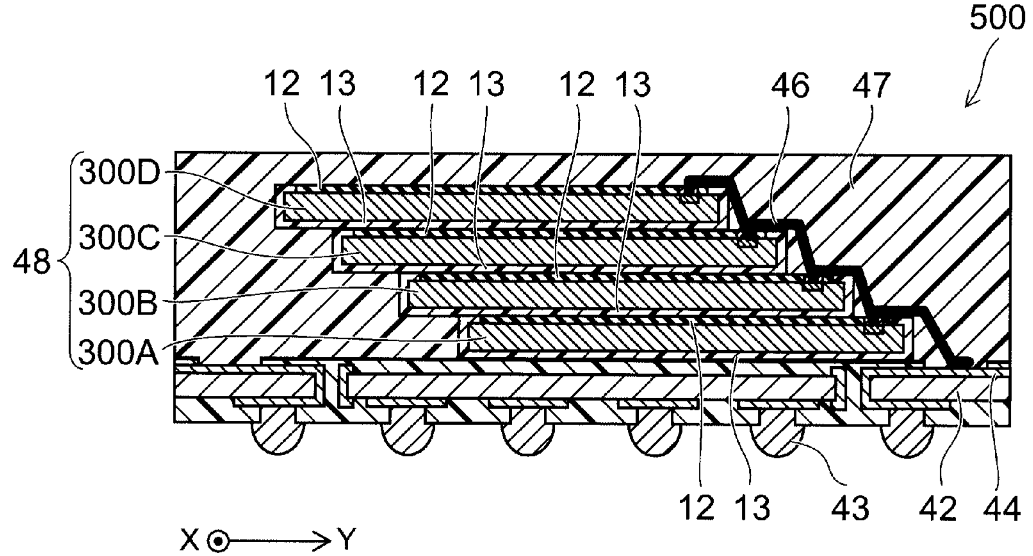

FIGS. 13A and 13B are schematic views illustrating a semiconductor apparatus 500 on which the semiconductor device 300 is mounted. FIG. 13A is a plan view illustrating a stacked structure 48 on which the semiconductor device 300 is stacked. FIG. 13B illustrates a cross-sectional structure of the semiconductor apparatus 500.

As illustrated in FIG. 13A, in the stacked structure 48, the electrode pads 3 of each of semiconductor devices 300A to 300D are exposed by stacking the semiconductor devices 300A to 300D with a diagonal shift (shift in the X direction and the Y direction).

The semiconductor devices 300A to 300D are stacked in such a way that the sides on which the electrode pads 3 are disposed face in the same direction. The insulating adhesive layer 13 is provided on the two side faces 2*c* along the edges provided with the electrode pads 3 of an element portion 8.

With the embodiment as well, effects similar to those of the first embodiment are obtained. The semiconductor apparatus 500 illustrated in FIG. 13B has the same structure as the semiconductor apparatus 400 illustrated in FIG. 10B except that the stacked structure 48 is mounted on the circuit substrate 42. With this configuration, it is possible to realize the miniaturization of the semiconductor apparatus 500 on which a plurality of semiconductor devices 300 that have a large number of the electrode pads 3 is mounted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:

a semiconductor device body formed with a square plate shape that has a first major surface, a second major surface opposite to the first major surface, and four side surfaces each contacting the first major surface and the second major surface, an element portion provided on the first major surface; and an insulating adhesive layer provided so as to cover the second major surface of the semiconductor device body and one or two of the four side surfaces of the semiconductor device body and extending onto the first major surface adjacent the one or two of the four side surfaces, the other side surfaces of the semiconductor device body being not covered with the insulating adhesive layer.

2. The device according to claim 1, wherein the insulating adhesive layer extends from the side surface to the first major surface and covers a corner between the side surface and the first major surface.

3. The device according to claim 1, further comprising an insulating protective film provided on a surface of the element portion, the semiconductor device body further including a peripheral portion provided on the first major surface so as to surround the element portion, the insulating adhesive layer extending from the side surface to the peripheral portion and being connected to the insulating protective film.

4. The device according to claim 1, further comprising an electrode pad provided at an edge of the element portion along at least one of the side surfaces covered with the insulating adhesive layer.

5. The device according to claim 1, further comprising a plurality of electrode pads disposed along the side of the semiconductor device at an edge of the element portion along at least one of the side surfaces covered with the insulating adhesive layer.

6. The device according to claim 5, further comprising an insulating protective film provided on a surface of the element portion, the electrode pad being exposed in an opening provided in the insulating protective film.

7. The device according to claim 1, wherein the insulating adhesive layer is a thermosetting resin.

8. The device according to claim 7, wherein the insulating adhesive layer is in a half-cured state.

9. The device according to claim 1, wherein the insulating adhesive layer is a thermoplastic resin.

10. A semiconductor apparatus comprising:

a substrate having a connection pad;

a semiconductor device mounted on the substrate, the semiconductor device including:

an element portion provided on a semiconductor device body formed with a square plate shape that has a first major surface, a second major surface opposite to the first major surface, and four side surfaces each contacting the first major surface and the second major surface, the element portion being provided on the first major surface;

an insulating adhesive layer covering the second major surface of the semiconductor device body and one or two of the four side surfaces of the semiconductor device body and extending onto the first major surface adjacent the one or two of the four side surfaces, the other side surfaces of the semiconductor body being not covered with the insulating film;

an electrode pad provided at an edge of the element portion along at least one of the side surfaces covered with the insulating adhesive layer; and a wire electrically connecting the electrode pad of the semiconductor device with the connection pad.

11. The apparatus according to claim 10, wherein the semiconductor device and the wire are sealed with a resin on the substrate, and the resin covers the one or two side surfaces of the semiconductor body via the insulating adhesive layer, and directly covers the other side surfaces of the semiconductor device body.

* * * * *